United States Patent [19]

Hilgers et al.

[11] Patent Number: 5,989,625
[45] Date of Patent: Nov. 23, 1999

[54] PROCESS OF SURFACE MODIFICATION OF MAGNETIC HEADS BY A REACTIVE GAS WITH $CF_3$ GROUPS

[75] Inventors: Heinz Hilgers; Pierre Joeris, both of Mainz; Martin Straub, Niederolm, all of Germany

[73] Assignee: International Business Machines Corporation, Armonk, N.Y.

[21] Appl. No.: 08/869,119

[22] Filed: Jun. 4, 1997

[30] Foreign Application Priority Data

Jun. 7, 1996 [DE] Germany ............... 196 22 732

[51] Int. Cl.⁶ ................................................. G11B 5/72
[52] U.S. Cl. ..................... 427/131; 427/132; 427/536; 427/577
[58] Field of Search ..................... 427/131, 132, 427/536, 577

[56] References Cited

U.S. PATENT DOCUMENTS

| | | | |
|---|---|---|---|
| 5,266,409 | 11/1993 | Schmidt et al. | 428/446 |
| 5,409,738 | 4/1995 | Matsunuma et al. | 427/502 |
| 5,661,618 | 8/1997 | Brown et al. | 360/97.02 |

FOREIGN PATENT DOCUMENTS

| | | | |
|---|---|---|---|
| 0 123 707 | 11/1984 | European Pat. Off. | G11B 5/72 |
| 0 332 784 | 9/1989 | European Pat. Off. | G11B 5/72 |
| 28 39 378 | 11/1979 | Germany | G11B 5/72 |
| WO 90/06575 | 6/1990 | WIPO | G11B 5/72 |

*Primary Examiner*—Stevan A. Resan
*Attorney, Agent, or Firm*—G. Marlin KNight

[57] ABSTRACT

A process is described for the modification of the outermost atomic layer of a substrate, such as a carbon layer having hydrogen atoms bonded at the surface, in a plasma chamber to covalently bond carbon-flourine groups such as $CF_3$ groups to carbon atoms in the surface. After establishing a plasma process in which both etching and deposition are ocurring, a fluorinated gas is injected into the chamber to allow $CF_3$ groups to bond to the surface. The process does not apply of a layer with a defined thickness, but rather conditions the surface for desired properties of high affinity for lubricants and low affinity for contaminants. The invention is particularly useful for heads and disks for use in magnetic recording.

15 Claims, 1 Drawing Sheet

PROCESS OF SURFACE MODIFICATION OF MAGNETIC HEADS BY A REACTIVE GAS WITH $CF_3$ GROUPS

FIELD OF THE INVENTION

The invention deals generally with the use of flourinated gases in plasma chambers to condition surfaces and particularly carbon surfaces for use in magnetic disks and magnetic heads.

BACKGROUND

Magnetic disks are data memories with a very large capacity. Millions of characters (bytes) can be stored on a magnetic disk about 95 mm in size.

In addition to high storage density, the disks must also have exact mechanical and tribological characteristics. In some applications, the disks move at a speed of approx. 5400 rotations per minute. This means that the outer edge of the disk is subjected to a speed of up to 100 km/h, in which the write/read head is only a few ten thousandths of a millimeter from the surface of the disk.

Only the greatest precision in manufacture and statistical process controls can achieve these quality requirements.

Since hard disk drives with low overhung magnetic heads have been manufactured, these hard disks have been equipped with a lubricant to prevent friction, abrasion and damage (tribological effects). The lubricant, generally a linear or branched perfluorinated polyether, is first applied to the disk, in order to ensure even surface distribution. Such an arrangement is known through DE- AS-28 39 378 and EP-A-0 123 707, for example.

Other systems are based on a selective vapour pressure reservoir, in which an additional vapourisable lubricant is introduced into the drive in order to achieve condensation from the vapour phase onto the critical areas.

If a magnetic head is now applied to a disk lubricated in this way and the drive started, the head is "contaminated" by the lubricants (lube) on the outer layer of the disk through molecular transfer from the disk to the head, which thus receives a layer of lubricant.

Within such an arrangement of magnetic head and disk to the hard disk interface, the air streaming past also comes across two fluorinated surfaces. Due to the autophobic character of the lube layer, the energy transferred in a chance contact between the head and the disk is reduced to a minimum.

The lubrication of the magnetic head too has the additional advantage in that the lubricant works as a chemical surface protector, as the affinity of organic materials, potential deposits and condensed products are greatly reduced.

U.S. Pat. No. 5,409,738 describes a recording medium consisting of a substrate, a thin film for picking up corresponding data, a protective layer on the magnetic layer as well as a layer of lubricant arranged on this protective layer. Through oxidative surface polymerisation in the plasma, this represents a manufactured product in which main molecule chains are chemically linked to the protective layer. In this way, impurities such as ho water or organic bonds getting between the disk and the lubricant can be avoided. This process has the disadvantage that on the surface of the substrate an additional discrete layer is created, which represents an additional interface and which can very easily contaminate the magnetic head. Wetting of the magnetic head with the lubricant does not take place.

In newer hard disk drives, the distance between head and disk is even smaller, in order that a higher storage density can be achieved. Naturally, even greater demands are made of the tribological characteristics of the interface between magnetic disk and head. To improve the surface hardness, a carbon layer which resembles diamond (carbon overcoat) is applied to the substrate surface, to which the lubricant is applied as a final layer. In this way, abrasion can be reduced and a smooth layer is achieved on the magnetic disk.

An additional "desired" lubrication of the magnetic head was not previously necessary, as the lube was applied automatically through the operation of the hard disk drive. It has been found that deliberate pre-lubrication of the magnetic head increases a problem already known to exist, known as stiction.

Whether the critical surface of the magnetic head is wetted first by the lube or by contamination depends, amongst other things, on the adsorption ratios. Generally, in such competitive processes, one is dealing with exclusion processes, i.e. should the pick up of contaminant droplets (e.g. oils) predominate, then the wetting with lube is all the more unlikely, because the surface has then changed its affinity more strongly towards picking up oils. The process tips in one direction or the other. This is also called autocatalytic affinity.

Should oil droplets be taken up, then they will accumulate on the back edge of the magnetic head through the flow of air. When the head has stopped moving on the disk, then this will be drawn by capillary attraction along the underside of the magnetic head in the gap between the head and the disk, and will thus stick the magnetic head onto the disk (glass disk effect). If the head does not move for a sufficiently long length of time and the sticking effect is correspondingly strong, this phenomenon can lead to the magnetic head being torn from its holder and to irreparable damage being caused to the magnetic disk.

Due to the increasing optimization of the interface towards greater storage density and smaller write/read distances, it now appears that a limit has been reached, in that the lube in the course of the initial use of a disk drive is no longer being transferred quickly enough from the disk to the head. Recent analytical observations on the part of the applicants have shown that dependent on selected write/read distances, also under conditions of several weeks of running, no traces of lube and almost no closed layers exist on the heads. On the other hand, in the first hours of running all types of contaminants such as plasticizers, outgassing products of adhesives and elastomers etc. were measured, which could be damaging for the operation of the drive and lead to failures due to stiction.

As no lube layer can be introduced directly onto the read head due to stiction problems described above, and on the other hand as a lack of protective layer leads to pick up of contaminants and thus to renewed stiction, the necessity exists of developing a process which allows a layer of lubrication to be applied to the carbon overcoat of the magnetic head without simultaneously having to accept the disadvantages of stiction effects. In addition, no further layer should have to be brought onto the magnetic head, as this would be soft in comparison to the hard carbon overcoat layer and thus could again occasion further contamination.

SUMMARY OF THE INVENTION

It is therefore the task of the invention to put forward an available process which allows the outer atomic layer of the diamond-like layer on the magnetic head to be modified in such a way that on the one hand great affinity is achieved towards the lubricants used, with, on the other hand, low affinity towards contaminants.

A further task of the invention is making such a process available without an additional layer having to be applied.

In addition, a task of the invention is to steer the autocatalytic process of material adsorption in the correct direction from the start.

The invention is a process for the modification of the outermost atom layer of layers applied to a substrate in plasma, in which covalent, fixed bonding of $CF_3$ groups are produced on the substrate. This does not deal with the application of a layer with a defined thickness, rather the conditioning of the surface to predetermine desired properties of adsorption and slip. A maximum change in physical parameters takes place at the same time as a minimum chemical change.

The invention is not limited to magnetic heads with diamond-like coatings, but can be used in general for the modification of the outer atomic layer of layers applied to a substrate. It is explained using such a hard disk interface solely for reasons of ease. The parameters can vary according to the substrate and the layers applied to it. An expert can determine the correct parameters after a simple experiment.

BRIEF DESCRIPTIONS OF THE DRAWING

FIG. 1 illustrates a chemical reaction using $CHF_3$.

DETAILED DESCRIPTION OF THE INVENTION

Figure 1:
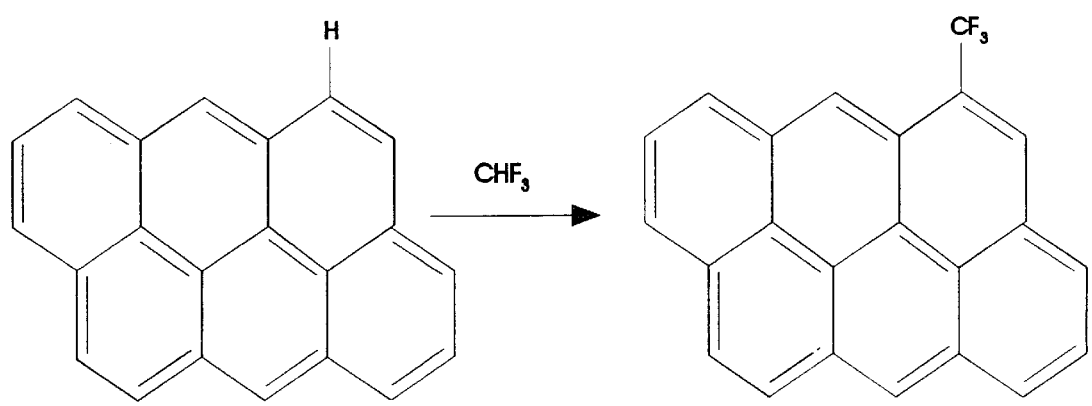

The most important functional groups of perfluoropolyethers which have proven themselves as lubricants are the —$CF_2$— and —$CF_3$—groups. These give the lubricant and the lubricated surface a "teflon-like" character with regard to properties of slip and affinity. Using the invention, these groups are generated directly on the magnetic head through modification of the carbon overcoat layer. In this, fixed covalent bonds are created on the surface of the substrate, which ensure the best chemical anchoring to the substrate.

In addition, the invention process avoids the formation of long polymer chains on the modified surface, in which per carbon atom statistically far fewer will be formed than bonds to the substrate. Using the invention process, the greatest number of fluorine atoms with a particularly high number of fixed bonds to the surface are captured without being transferred to a closed layer.

In order to change the surface of the magnetic head as evenly as possible and to avoid the formation of an island effect such as with chemical dip or condensation methods (these would lead to functionally untenable surface inhomogeneities and boundary layer effects), radical and ionic plasma processes are particularly suitable.

Such processes are normally carried out in a plasma chamber or reactor, where such a chamber can work in principle in two different modes. If, for example, gases are used such as $SF_6$, etc, at a certain pressure and a certain RF generator output, then the chamber works in etch mode, i.e. under certain conditions the surface of the substrate to be processed is worn away (RIE—reactive ion etching).

If, on the other hand, hydrocarbons are used such as $CH_4$, also at a certain pressure and/or RF generator output, then additional layers will be precipitated onto the substrate (CVD—chemical vapour deposition), the chamber thus working in deposition mode.

If the chamber is operated in such a way that both these modes are in equilibrium, then a state can be reached where etching and deposition are in balance.

This allows the working method of the chamber to be set up to fundamentally decisive parameters, these being pressure, gas con position and RF generator output, so that neither too much etching nor too large a deposition takes place, but rather that the surface of the substrate to be processed is simply activated.

If, for example, argon is used as a reaction gas at a pressure of approx. $2 \times 10^{-3}$ mbar to approx. $8 \times 10^{-3}$ mbar, preferably $6 \times 10^{-3}$ mbar, and a RF generator output of approx. 100W to approx. 250W, preferably 150W, then first the upper boundary layer of the substrate will be activated by $Ar^+$ ions (pre-conditioning), so that now certain functional groups can bond easily to this activated surface.

At the end of a plasma process, the surface of a substrate has very many reactive places and thus a high degree of reactiveness. If the process is switched off, the upper layer automatically stabilises itself e.g. through recombination processes and reactions with environmental molecules. If one does not leave this process to chance, but "extinguishes" the plasma torch under defined conditions, i.e. by specific supply of an additional fluorinated gas, the upper atom layers will be correspondingly controllably modified by this gas. In the invention, for example, $CHF_3$ is used in the range of 10% as an additional constituent of the gas mixture, although other fluoric gases can be used. In this, according to the reaction equation (a), the substrate is modified by the bonding separation so that the $CF_3$— groups of the additional gas are taken up by the substrate material. Through secondary reactions —$CF_2$— and —CF— groups are also taken up, but only to a small extent. In this way, the surface tension of the substrate material changes in such a way that increased affinity to lubricants and simultaneously low affinity to impurities occur. This phenomenon is clearly measurable and controllable using wetting angle measurements. Consequently, the lubricant can get onto the magnetic head on starting the disk drive, before the magnetic head is contaminated with impurities. See FIG. 1.

Using analytical characterisation (ESCA, laser-ICR, wetting angle measurements) it can be proven that the desired groups exclusively form on the surface of the carbon substrate. This modification, simply of the outer atom layer, is sufficient to achieve the required change in the surface tension. Even deliberately created layers of a defined thickness do not show changes in the surface tension which are any more favourable. Moreover, they are not wanted due to possible abrasion and the danger of possible contamination. Magnetic heads modified in this way were built into a hard disk drive and underwent a stiction test. In this, these disk drives did not show high motor currents after 30 days, which would have been an indication of stiction.

EXAMPLE

Firstly, decisive surface geometry using reactive ion etching processes and ion beam etching was produced for the flying qualities of the magnetic head. To protect the magnetic head from mechanical wear and chemical corrosion, a thin protective coat of diamond-like carbon (carbon overcoat, COC) is applied. At the end of the process, to improve the selective adhesion qualities of this layer and the associated better slip of the magnetic head on the extremely thin film disk, the upper atom layer of this COC layer is modified using the invention process.

In this, a plasma is ignited in a gas mixture of approx. 20–40 sccm argon (preferably 20 sccm) and 40–2000 sccm (preferably 200 sccm) $CHF_3$ at a generator output of 100–250W (preferably 150W), and the surface of the substrate is thus modified.

The application of a COC layer and the modification of the surface can either be carried out immediately after one another or in a two-stage process, where the plasma chamber is reconditioned to the corresponding pressure and composition ratios. The latter working method creates reproducible results and makes the process independent of previous process conditions.

The process described here has the advantage that owing to the modification of only the outer atom layer of the substrate, no precipitation of an additional layer is necessary, which could also be a source of impurities. In addition, there is no additional magnetic spacing (effective distance between magnetic layer and write/read element at a constant height). Further, in this way the surface parameters such as adsorption, desorption and slip can be specifically controlled without the positive characteristics of the carbon overcoat being lost. A change in its hardness cannot be measured. A further advantage of the invention process can be seen in the fact that no additional hardware is required for carrying out the process.

The surface modification described here for conditioning tribological layers can be applied not only to the carbon overcoat of magnetic heads, but also, for example, to the carbon layers of magnetic disks.

Further application possibilities of the modification process using $CHF_3$ can be found in glue and adhesive technologies as well as in the conditioning of ensuing polymerisation. Here the process can be used above all for the checking of interfaces between the substrate and coating. The bonding of the first atom layer is thus predefined.

The use of further fluorinated gases is equally possible. There must however be at least one hydrogen atom in the reactant.

What is claimed is:

1. A method for bonding $CF_3$ to the surface of a substrate in a plasma chamber comprising the steps of:

establishing approximate equilibrium between etching and gas phase deposition in the plasma chamber using at least one activating gas for activating atoms in the surface of the substrate; and injecting into the plasma chamber a reactive gas with $CF_3$ groups which bond chemically with the atoms in the surface of the substrate.

2. The method of claim 1 wherein the substrate is a magnetic head or a magnetic disk.

3. The method of claim 1 wherein the surface of the substrate is carbon.

4. The method of claim 1 wherein the activating gas is an inert gas.

5. The method of claim 1 wherein the activating gas is argon.

6. The method of claim 1 wherein the reactive gas is $CHF_3$.

7. The method of claim 1 wherein the activating gas is argon and the reactive gas is $CHF_3$.

8. The method of claim 1 further comprising the step of setting a gas pressure in the plasma chamber in the range from $2 \times 10^{-3}$ mbar to $8 \times 10^{-3}$ mbar.

9. The method of claim 1 further comprising the step of setting an RF generator output from 100W to 250W.

10. The method of claim 1 wherein the reactive gas is $CHF_3$ in the range of 10% of a total gas mixture.

11. A method of chemically altering a carbon surface, which has at least some hydrogen atoms bonded at the surface, in a plasma chamber comprising the steps of:

establishing a plasma process in which both etching and deposition are ocurring to activate the surface of the carbon;

adding a flourinated gas which acts to replace at least some of the hydrogen atoms on the surface with carbon-flourine groups; and extinguishing the plasma process.

12. The method of claim 11 wherein the establishing step further comprises the step of adding argon to the plasma chamber at a pressure of approximately $2 \times 10^{-3}$ to $8 \times 10^{-3}$ mbar.

13. The method of claim 12 wherein the flourinated gas is $CHF_3$.

14. The method of claim 11 wherein the flourinated gas is $CHF_3$.

15. The method of claim 11 wherein at least some of the carbon-flourine groups are $CF_3$.

* * * * *